United States Patent
Wang et al.

(10) Patent No.: US 11,600,431 B2
(45) Date of Patent: *Mar. 7, 2023

(54) INFO COIL ON METAL PLATE WITH SLOT

(71) Applicant: Taiwan Semiconductor Manufacturing Co., Ltd., Hsinchu (TW)

(72) Inventors: Chuei-Tang Wang, Taichung (TW); Wei-Ting Chen, Tainan (TW); Chieh-Yen Chen, Taipei (TW); Hao-Yi Tsai, Hsinchu (TW); Ming Hung Tseng, Toufen Township (TW); Hung-Yi Kuo, Taipei (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 81 days.

This patent is subject to a terminal disclaimer.

(21) Appl. No.: 17/092,887

(22) Filed: Nov. 9, 2020

(65) Prior Publication Data
US 2021/0057144 A1    Feb. 25, 2021

Related U.S. Application Data

(63) Continuation of application No. 16/125,923, filed on Sep. 10, 2018, now Pat. No. 10,847,304, which is a
(Continued)

(51) Int. Cl.
| H01F 27/28 | (2006.01) |
| H01F 27/36 | (2006.01) |
(Continued)

(52) U.S. Cl.
CPC ......... *H01F 27/2804* (2013.01); *H01F 27/36* (2013.01); *H01F 27/363* (2020.08);
(Continued)

(58) Field of Classification Search
None
See application file for complete search history.

(56) References Cited

U.S. PATENT DOCUMENTS

| 4,788,524 A | 11/1988 | Ozaki |
| 8,361,842 B2 | 1/2013 | Yu et al. |
(Continued)

FOREIGN PATENT DOCUMENTS

| JP | H07029223 A | 1/1995 |
| JP | 2010050136 A | 3/2010 |
(Continued)

*Primary Examiner* — Long Pham
(74) *Attorney, Agent, or Firm* — Slater Matsil, LLP

(57) ABSTRACT

A structure includes an encapsulating material, and a coil including a through-conductor. The through-conductor is in the encapsulating material, with a top surface of the through-conductor coplanar with a top surface of the encapsulating material, and a bottom surface of the through-conductor coplanar with a bottom surface of the encapsulating material. A metal plate is underlying the encapsulating material. A slot is in the metal plate and filled with a dielectric material. The slot has a portion overlapped by the coil.

20 Claims, 16 Drawing Sheets

Related U.S. Application Data continuation of application No. 15/061,419, filed on Mar. 4, 2016, now Pat. No. 10,074,472.

(60) Provisional application No. 62/267,622, filed on Dec. 15, 2015.

(51) Int. Cl.
*H01F 38/14* (2006.01)
*H05K 1/16* (2006.01)

(52) U.S. Cl.
CPC ...... *H01F 38/14* (2013.01); *H01F 2027/2809* (2013.01); *H05K 1/165* (2013.01)

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,074,472 B2 * | 9/2018 | Wang | H01F 27/363 |
| 10,847,304 B2 * | 11/2020 | Wang | H01F 27/363 |
| 2009/0017733 A1 | 1/2009 | Takahashi et al. | |
| 2010/0289126 A1 | 11/2010 | Pagaila et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0076617 A1 | 3/2014 | Chen et al. | |
| 2014/0183735 A1 | 7/2014 | Zhang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0021754 A1 | 1/2015 | Lin et al. | |
| 2016/0276424 A1 | 9/2016 | Duevel et al. | |

FOREIGN PATENT DOCUMENTS

| | | |
|---|---|---|
| KR | 20070116531 A | 12/2007 |
| KR | 20140038283 A | 3/2014 |
| TW | 506045 B | 10/2002 |
| TW | 201240044 A1 | 10/2012 |
| TW | 201340136 A | 10/2013 |

\* cited by examiner

INFO COIL ON METAL PLATE WITH SLOT

PRIORITY CLAIM

This application is a continuation of U.S. patent application Ser. No. 16/125,923, filed Sep. 10, 2018, and entitled "InFO Coil on Metal Plate With Slot," which is a continuation of U.S. patent application Ser. No. 15/061,419, filed Mar. 4, 2016, and entitled "InFO Coil on Metal Plate With Slot," now U.S. Pat. No. 10,074,472 issued Sep. 11, 2018, which claims the benefit of the U.S. Provisional Application No. 62/267,622, filed Dec. 15, 2015, and entitled "InFO Coil and Performance Improvement Method," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. This packaging technology suffers from drawbacks. For example, the sizes of the dies are becoming increasingly smaller, and the respective packages can only be fan-in type packages, in which the I/O pads of each die are limited to the region directly over the surface of the respective die. With the limited areas of the dies, however, the number of the I/O pads is limited due to the limitation of the pitch of the I/O pads. If the pitch of the pads is to be decreased, solder regions may bridge with each other, causing circuit failure. Additionally, under the fixed ball-size requirement, solder balls must have a certain size, which in turn limits the number of solder balls that can be packed on the surface of a die. Accordingly, Integrated Fan-Out (InFO) packages have been developed.

InFO packages are not suitable for making coils that are used for certain applications such as wireless charging. Due to the small size of the InFO packages, the coils, if made in the InFO packages, would be small. The mutual inductance between the coils in the InFO packages and the coils outside of the InFO packages will be low, and cannot meet the requirement of wireless power transfer through magnetic resonance. On the other hand, the mutual inductance also cannot be increased by increasing the number of turns of the coils since this will cause the resistance to be increased, which in turn causes the dramatic reduction of the efficiency of the power transfer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
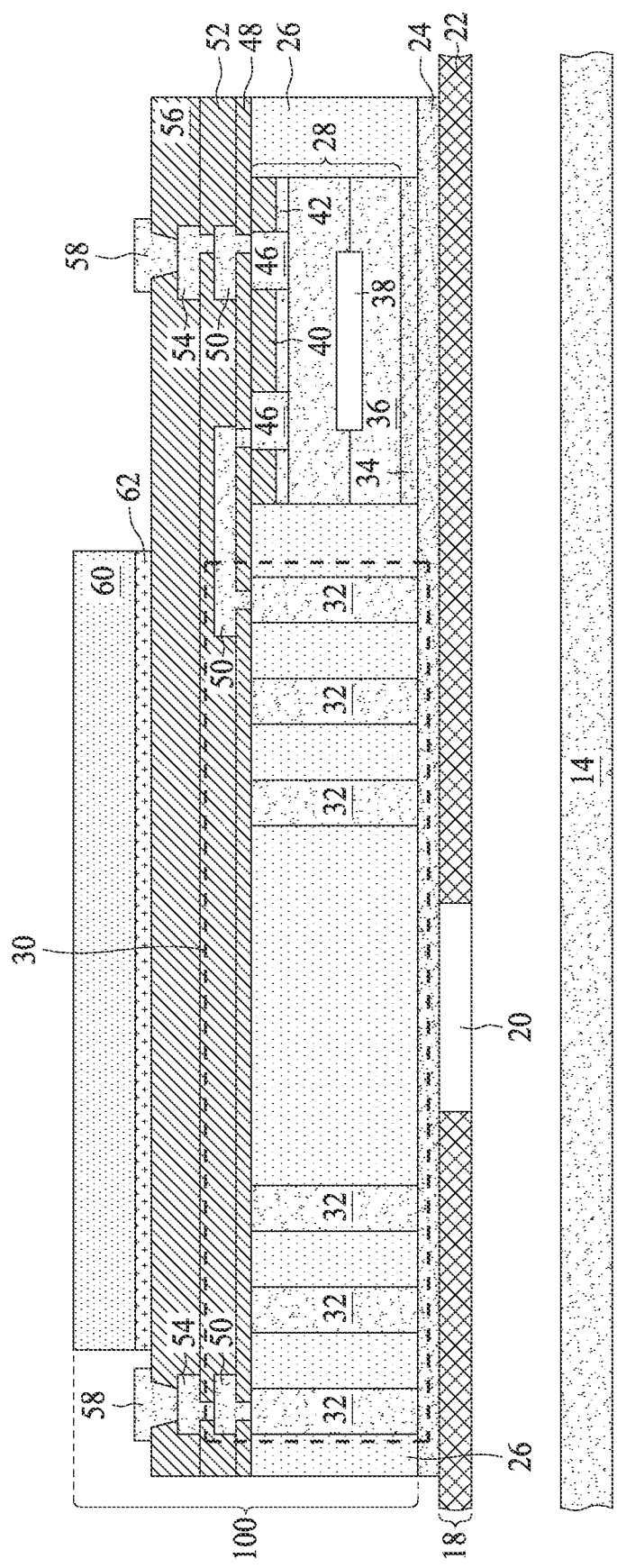
FIG. 1 illustrates the cross-sectional view of an Integrated Fan-Out (InFO) package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and a coil in the InFO package are provided in accordance with various exemplary embodiments. The coils in the InFO packages are referred to as InFO coils throughout the description. Some variations of some embodiments are discussed. Throughout the various views and illustrative embodiments, like reference numbers are used to designate like elements.

FIG. 1 illustrates a cross-sectional view of InFO package 100 in accordance with some embodiments of the present disclosure. InFO package 100 includes device die 28 encapsulated in encapsulating material 26. In addition, through-conductors 32, which form parts of InFO coil 30, are also encapsulated in encapsulating material 26. Encapsulating material 26 fills the gaps between neighboring through-conductors 32 and the gaps between through-conductors 32 and device die 28. Encapsulating material 26 may be a polymer-based material, and may include a molding compound, a molding underfill, an epoxy, and/or a resin. The top surface of encapsulating material 26 is level with the top ends of device die 28, which may be achieved through, for example, Chemical Mechanical Polish (CMP).

Figure 2:
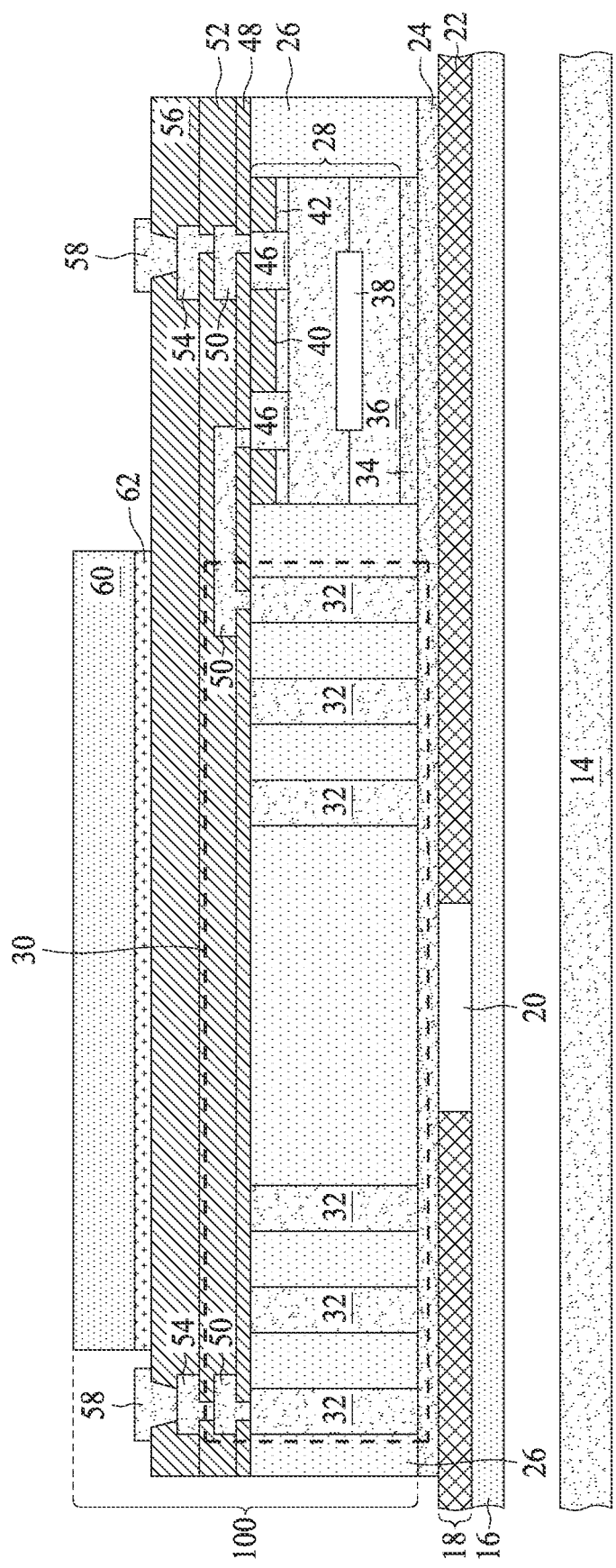
FIG. 2 illustrates the cross-sectional view of an InFO package including a sealed air gap in accordance with some embodiments.
Figure 3:
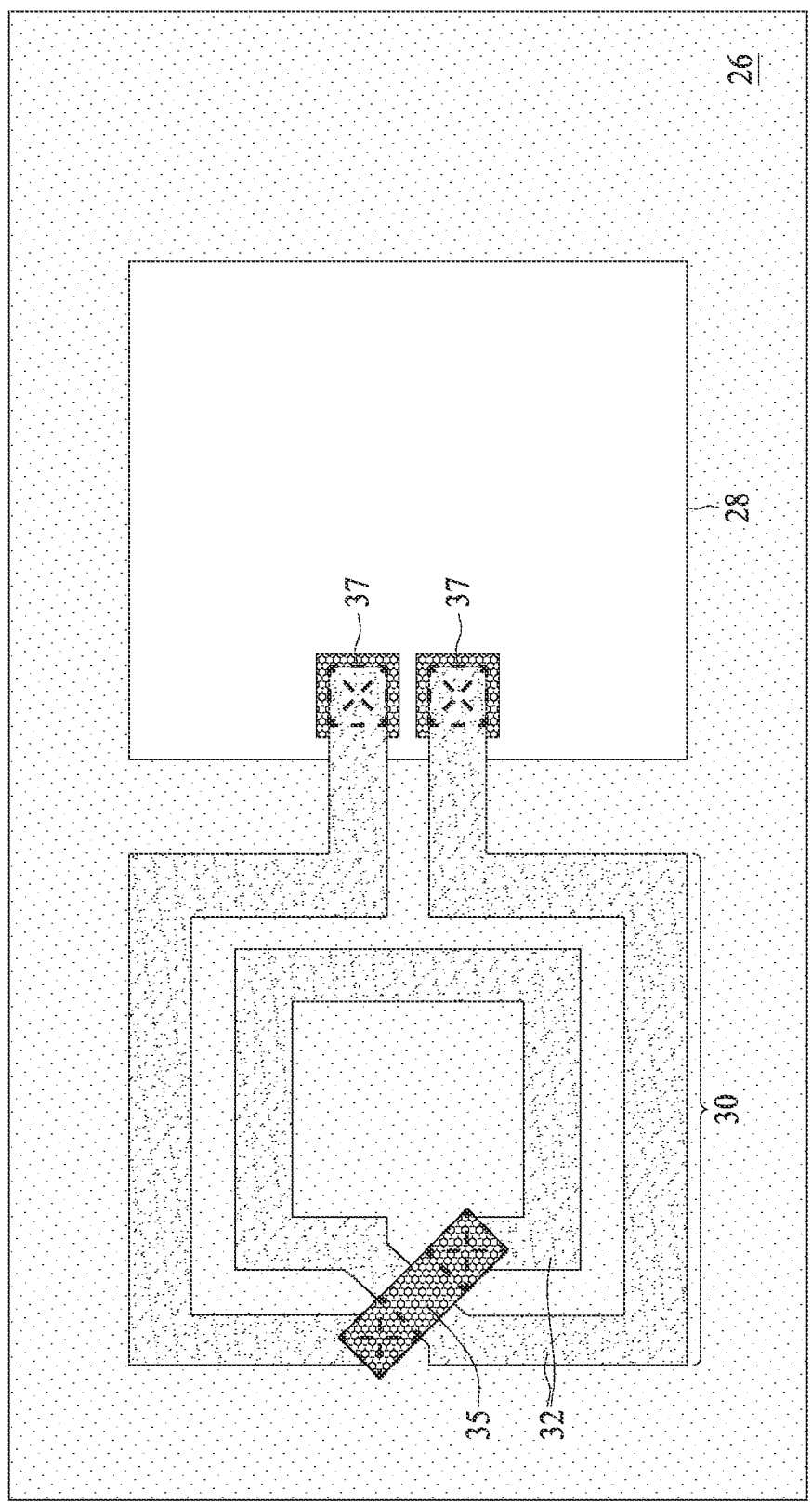
FIGS. 3 and 4 illustrate top views of coils and the connecting device dies in accordance with some embodiments.
Figure 4:
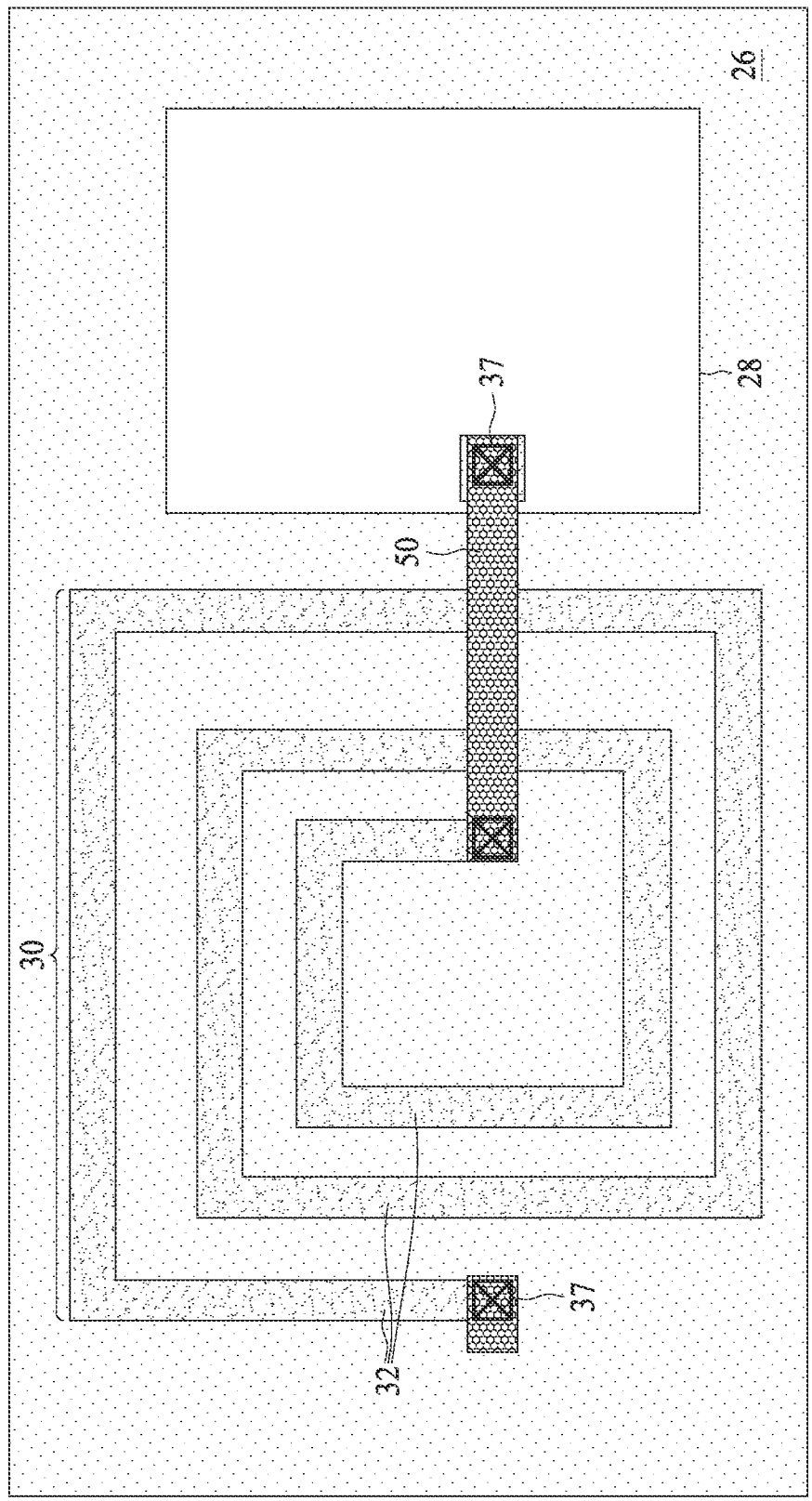

InFO coil 30 acts as an inductor, and may have various applicable shapes. For example, FIGS. 3 and 4 illustrate the top views of exemplary inductors/coils in accordance with some exemplary embodiments. In FIG. 3, through-conductors 32 form a plurality of concentric rings, with the outer rings encircling the inner rings. In FIG. 3, two rings are illustrated, while any other number of rings (such as 1, 3, or more) is also contemplated. The rings are partial rings having breaks, which allow the outer rings to be connected to the inner rings through bridge(s) 35. The plurality of rings is serially connected to two ports 37. The ports of coil 30 are connected to device die 28. In FIG. 4, through-conductors 32 are portions of an integrated spiral, which also have ports 37. FIG. 4 illustrates that the left port 37 is disconnected from device die 28. In alternative embodiments, the left port 37 may also be connected to device die 28, for example, through the redistribution lines 50 and 54 as shown in FIGS. 1 and 2.

Referring back to FIG. 1, through-conductors 32 have top surfaces substantially coplanar with the top surface of encapsulating material 26, and bottom surfaces substantially coplanar with the bottom surface of encapsulating material 26. Throughout the description, when the term "substantially coplanar" is used, the respective "planar surfaces" may still have height differences that are within the variation of the respective manufacturing processes.

Device die 28 may be adhered to adhesive film 24 through Die-Attach Film (DAF) 34, which is an adhesive film. DAF 34 may also be omitted, and device die 28 is adhered to adhesive film 24 directly. Device die 28 may have the function of receiving current from coil 30, rectifying the current, and charging a battery (not shown). Although one device die 28 is illustrated, more device dies may be placed over adhesive film 24, which device dies may include a Central Processing Unit (CPU) die, a Micro Control Unit (MCU) die, an Input-output (IO) die, a BaseBand (BB) die, and/or an Application Processor (AP) die.

Device die 28 may include semiconductor substrate 36, which may be a silicon substrate. Integrated circuit devices 38 are formed on semiconductor substrate 36. Integrated circuit devices 38 may include active devices such as transistors and diodes and/or passive devices such as resistors, capacitors, inductors, or the like. Device die 28 may include metal pillars 46 electrically coupled to integrated circuit devices 38. Metal pillars 46 may be embedded in dielectric layer 40, which may be formed of PBO or polyimide, for example. Passivation layer 42 is also illustrated, wherein metal pillars 46 may extend into passivation layer 42. Passivation layer 42 may include silicon nitride, silicon oxide, or multi-layers thereof.

Dielectric layer 48 is formed over encapsulating material 26. In accordance with some embodiments of the present disclosure, dielectric layer 48 is formed of a polymer such as PBO, polyimide, or the like. In accordance with alternative embodiments of the present disclosure, dielectric layer 48 is formed of an inorganic material such as silicon nitride, silicon oxide, or the like.

Redistribution Lines (RDLs) 50 are formed to electrically couple to metal pillars 46 and through-conductors 32. RDLs 50 may also interconnect metal pillars 46 and through-conductors 32. In addition, RDLs 50 may be used to form bridge 35 (FIG. 3) of inductor 30. RDLs 50 include metal traces (metal lines) over dielectric layer 48 and vias extending into dielectric layer 48. The vias in RDLs 50 are connected to through-conductors 32 and metal pillars 46. In accordance with some embodiments of the present disclosure, the formation of RDLs 50 includes forming a blanket copper seed layer, forming and patterning a mask layer over the blanket copper seed layer, performing a plating to form RDLs 50, removing the mask layer, and etching the portions of the blanket copper seed layer not covered by RDLs 50. RDLs 50 may be formed of a metal or a metal alloy including aluminum, copper, nickel, tungsten, and/or alloys thereof.

Dielectric layer 52 is formed over dielectric layer 48 and RDLs 50. Dielectric layer 52 may be formed using a material selected from the same candidate materials for forming dielectric layer 48. RDLs 54 are formed to have some portion inside dielectric layer 52, and some other portions over dielectric layer 52. RDLs 54 may also be formed of a metal or a metal alloy including aluminum, copper, tungsten, and/or alloys thereof. It is appreciated that although in the illustrated exemplary embodiments, two layers of RDLs (50 and 54) are formed, the RDLs may have any number of layers such as one layer or more than two layers.

Dielectric layer 56 is formed over dielectric layer 52 and RDLs 54. Dielectric layer 56 may be formed, for example, using PBO, polyimide, or BCB. Electrical connectors 58 have some portion inside dielectric layer 56, and some other portions over dielectric layer 56. Electrical connectors 58 are formed to electrically connect to RDLs 54. Electrical connectors 58 may include Under-Bump Metallurgies (UBMs), metal pillars, solder regions, and/or the like. In accordance with some exemplary embodiments, electrical connectors 58 are electrically connected to a flex Printed Circuit Board (PCB, not shown).

In accordance with some embodiments, ferrite material 60, which may be a pre-formed plate, is adhered to a top surface layer such as layer 56. The adhesion may be achieved through adhesive film 62. Ferrite material 60 in accordance with some embodiments may include manganese-zinc, nickel-zinc, or the like. Ferrite material 60 has low losses at high frequencies, and is used to improve the performance (such as the mutual inductance) of InFO coil 30. Ferrite material 60 overlaps a portion of the encapsulating material 26. Furthermore, ferrite material 60 overlaps at least a part of InFO coil 30, and may or may not extend beyond the edges of InFO coil 30.

Throughout the description of the present disclosure, the features over adhesive film 24 including electrical connectors 58, device die 28, encapsulating material 26, and through-conductors 32 are in combination referred to as InFO package 100. Slot-containing metal plate 18 is underlying, and is overlapped by, InFO package 100. In accordance with some embodiments of the present disclosure, InFO package 100 is adhered to slot-containing metal plate 18 through adhesive film 24.

Slot-containing metal plate 18 includes metal plate 22, and dielectric material 20 in the slot of metal plate 22. Throughout the description, reference numeral 20 is used to refer to both the slots in slot-containing metal plate 18 and the dielectric material in the slots. In accordance with some embodiments of the present disclosure, metal plate 22 is formed of a metal or a metal alloy, which is formed of copper, aluminum, nickel, chromium, an anodized metal, and/or the like. Dielectric material 20 may fully or partially fill the slot in metal plate 22. In accordance with some embodiments, dielectric material 20 is formed of an organic material such as plastic or polymer, or an inorganic dielectric material such as glass, oxide, ceramic, or the like. Dielectric material 20 may be transparent or opaque.

Metal plate 22 and dielectric material 20 may have top surfaces substantially coplanar with each other, and/or bottom surfaces coplanar with each other. In accordance with some embodiments of the present disclosure, metal plate 22 and dielectric material 20 in combination form a part of a casing, which may be the casing of a mobile phone, a tablet, or a computer, for example. The illustrated portion of the casing is a lower part, and the casing may further include an upper part overlying, and portions (not shown) on the left side and right of, the illustrated part.

FIG. 2 illustrates InFO package 100 and slot-containing metal plate 18 in accordance with alternative embodiments. Slot-containing metal plate 18 includes slot 20 therein, wherein slot 20 is an air gap not filled with solid dielectric materials. Alternatively stated, slot 20 is filled with air, and hence forming a dielectric region. Dielectric film 16 is used to cover slot 20, wherein dielectric film 16 and adhesive 24 seal slot 20. Throughout the description, when the term "dielectric material 20" is referred to, it indicates that dielectric material 20 may be a solid dielectric material or air. Dielectric film 16 may also be formed of a dielectric material such as a plastic, a glass, a ceramic, or the like.

Figure 5:
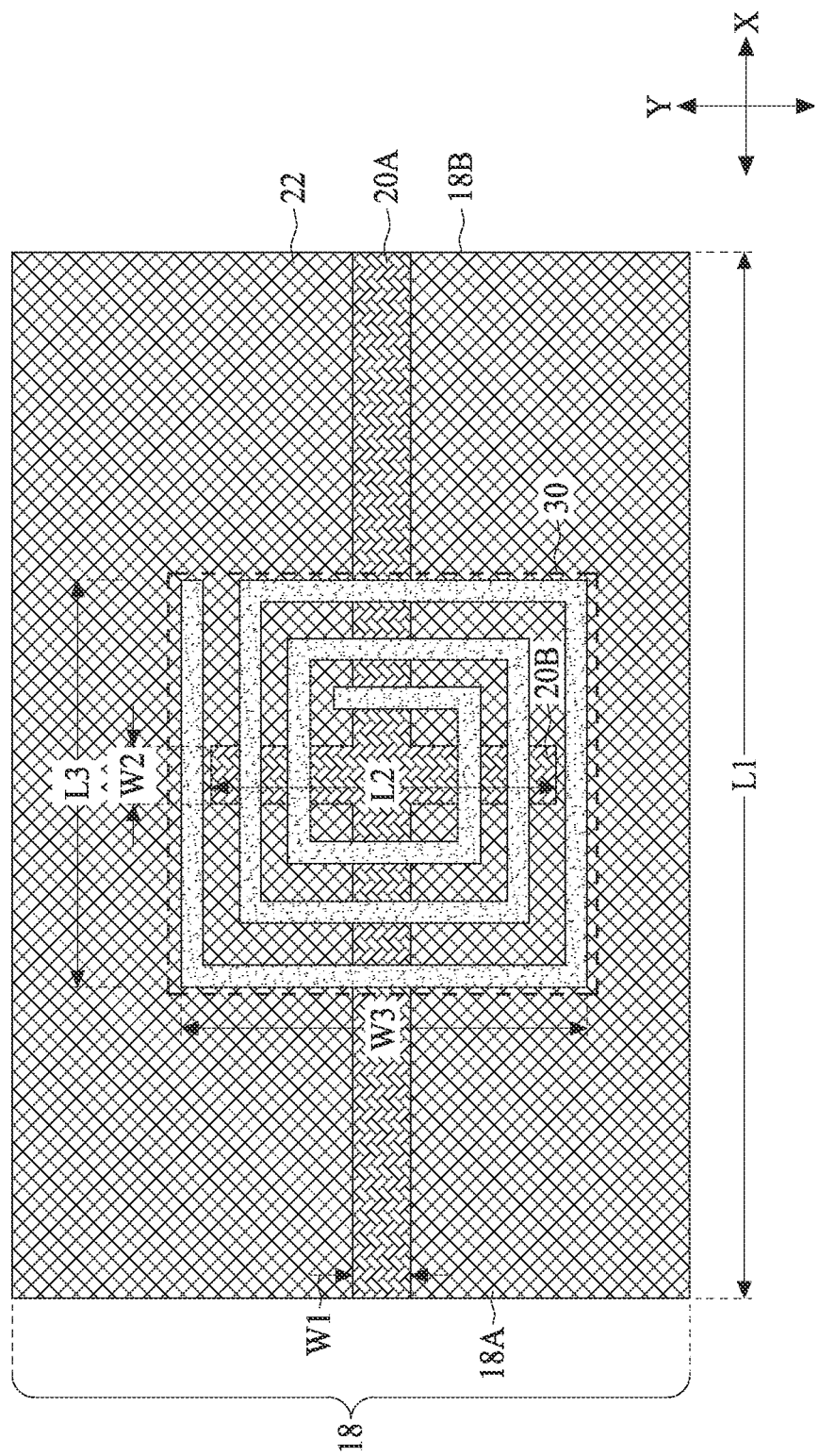
FIGS. 5, 9, 11, 13, and 15 illustrate the top views of coils and the respective metal plates and dielectric regions in the metal plates in accordance with some embodiments.

FIG. 5 illustrates a top view of a part of the structure shown in FIGS. 1 and 2 in accordance with some exemplary embodiments, with coil 30 and slot-containing metal plate 18 illustrated. Other materials and regions such as dielectric layers 48, 52, and 56, device die 28, and the like as shown in FIGS. 1 and 2 are not illustrated, while they still exist. Dielectric material 20 includes portions 20A and 20B (referred to as a dielectric portions or slot portions hereinafter). Dielectric portion 20A has a lengthwise direction parallel to a first direction (X direction). Portion 20B has a lengthwise direction un-parallel to the lengthwise direction of portion 20A. In accordance with some embodiments of the present disclosure, the lengthwise direction of portion 20B is in the Y direction, which is perpendicular to the lengthwise direction of portion 20A. Portions 20A and 20B may also be neither parallel to nor perpendicular to each other. Furthermore, portion 20A may be longer than portion 20B. Portion 20A and portion 20B are joined with each other to form a cross.

In accordance with some embodiments, slot-containing metal plate 18 has edges 18A and 18B opposite to each other. Edges 18A and 18B may or may not be parallel to each other, depending on the shape and the usage of slot-containing metal plate 18. For example, when slot-containing metal plate 18 is used as the back cover of a mobile phone, the shape of slot-containing metal plate 18 is determined by the shape of the mobile phone, and edges 18A and 18B may be parallel to each other. Slot portion 20A has length L1 and width W1. Length L1 in accordance with these embodiments is greater than length L3 of coil 30, and is equal to the length of slot-containing metal plate 18. Width W1 of slot portion 20A is smaller than length L1, and may be smaller than the width W3 of coil 30.

Portion 20B of dielectric material 20 has length L2 and width W2 smaller than length L2. Furthermore, width W2 may be equal to, greater than, or smaller than, width W1 of portion 20A. In accordance with some embodiments of the present application, length L2 of portion 20B is smaller than width W3 of coil 30, and width W2 of portion 20B is smaller than both length L3 and width W3 of coil 30.

Furthermore, portion 20A may extend beyond the edges of coil 30 in opposite X directions. On the other hand, portion 20B may be fully in the region overlapped by coil 30, and does not extend beyond the edges of coil 30 (as shown in FIG. 5). Alternatively, portion 20B may also extend beyond the edges of coil 30 in one or both of the Y directions. In accordance with some exemplary embodiments, the intersection area of portions 20A and 20B is aligned to coil 30. The center of the intersection area may be aligned to the center of coil 30 to maximize the magnification effect, as is discussed in subsequent paragraphs.

The InFO coil 30 as shown in FIG. 5 has improved mutual inductance with an external coil 14 (FIG. 1 or 2). As shown in FIGS. 1 and 2, coil 14 is placed outside of InFO package 100, and may be outside of the product (such as a mobile phone) in which InFO package 100 is located. Coil 14 may be used as a transmitter coil for transmitting energy, for example, while InFo coil 30 is used as a receiver coil for receiving the energy transmitted by coil 14.

Figure 6:
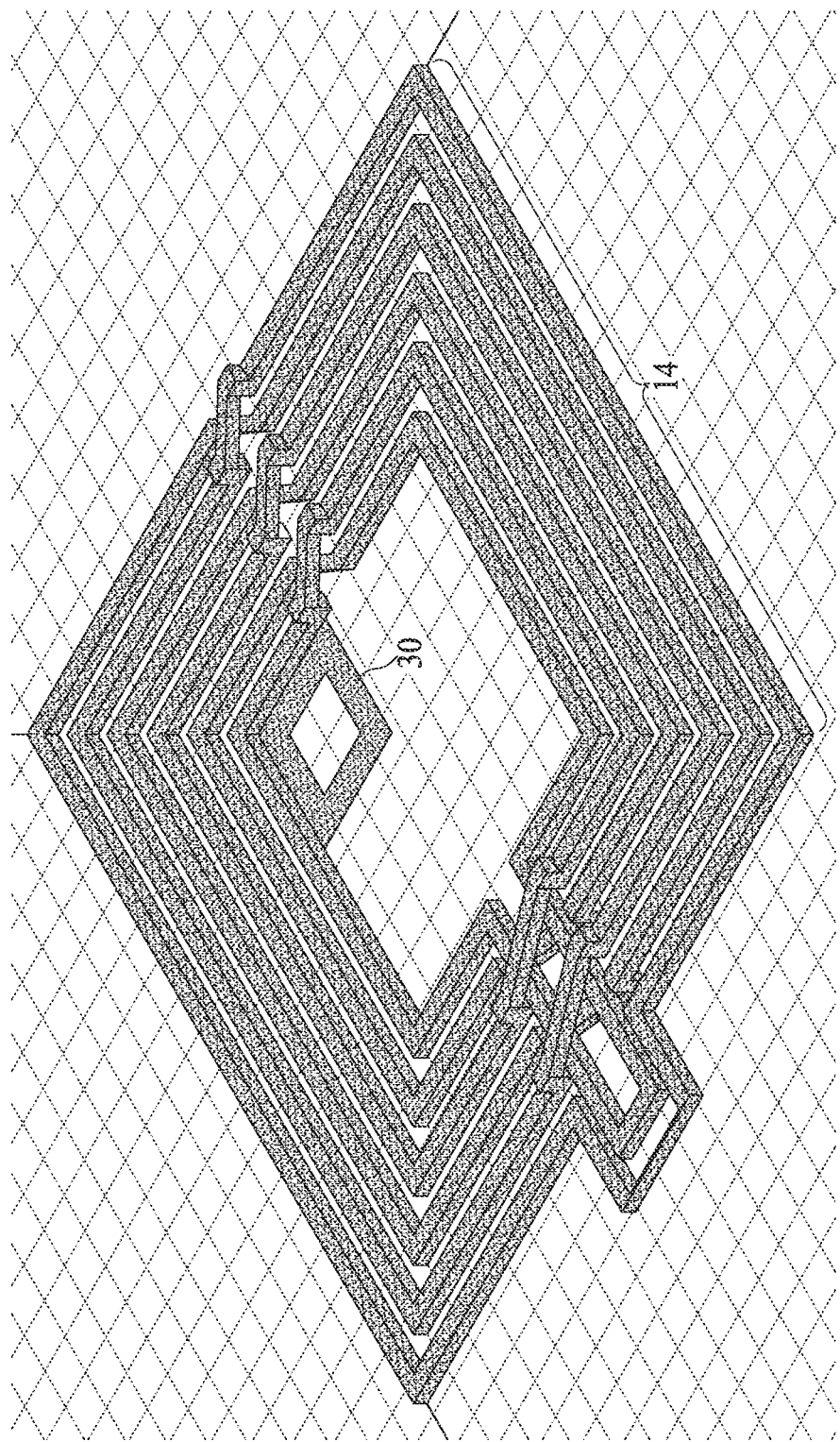
FIGS. 6-8, 10, 12, 14, and 16 illustrate the structures used for simulations in accordance with some embodiments.
Figure 7:
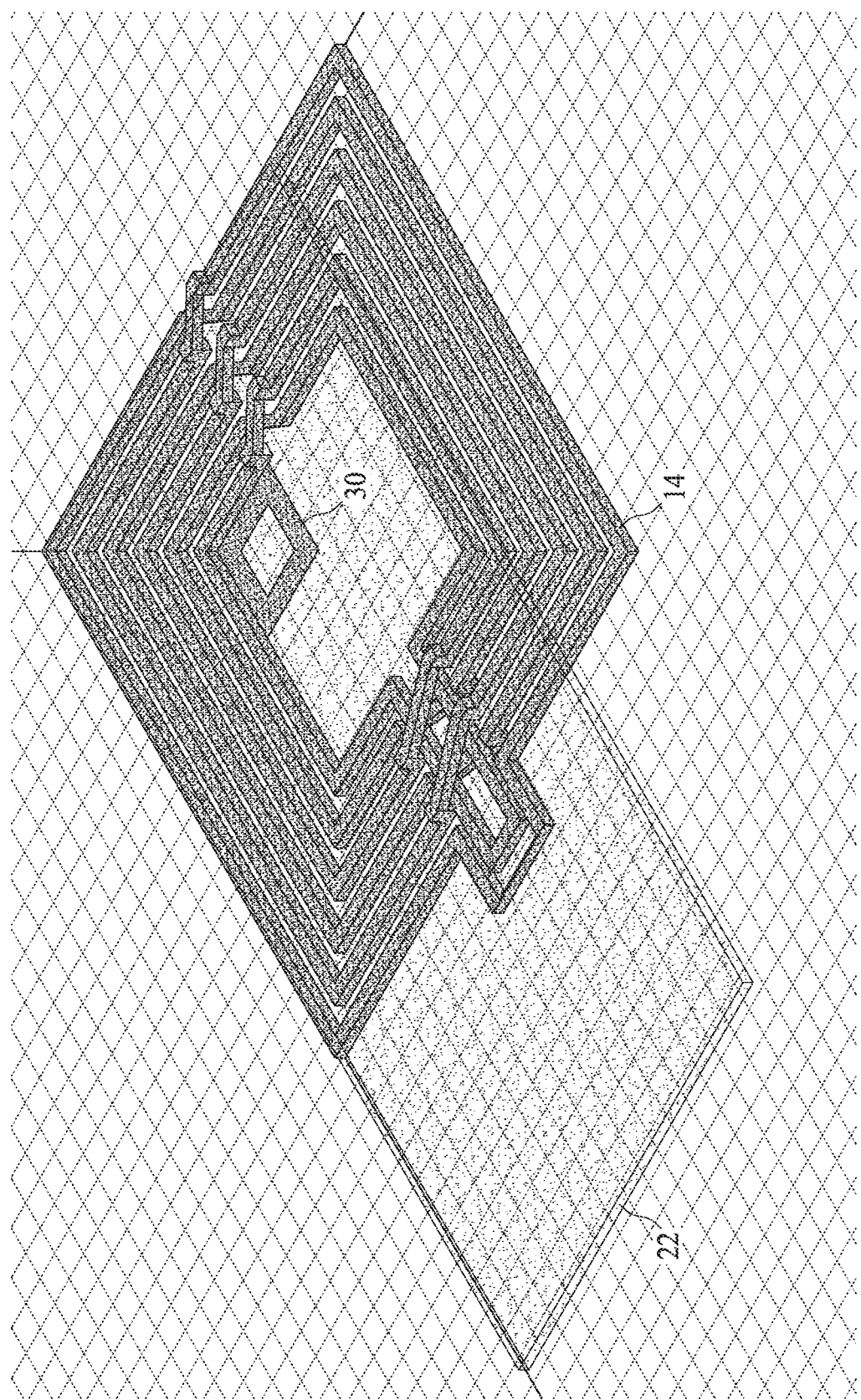
Figure 8:
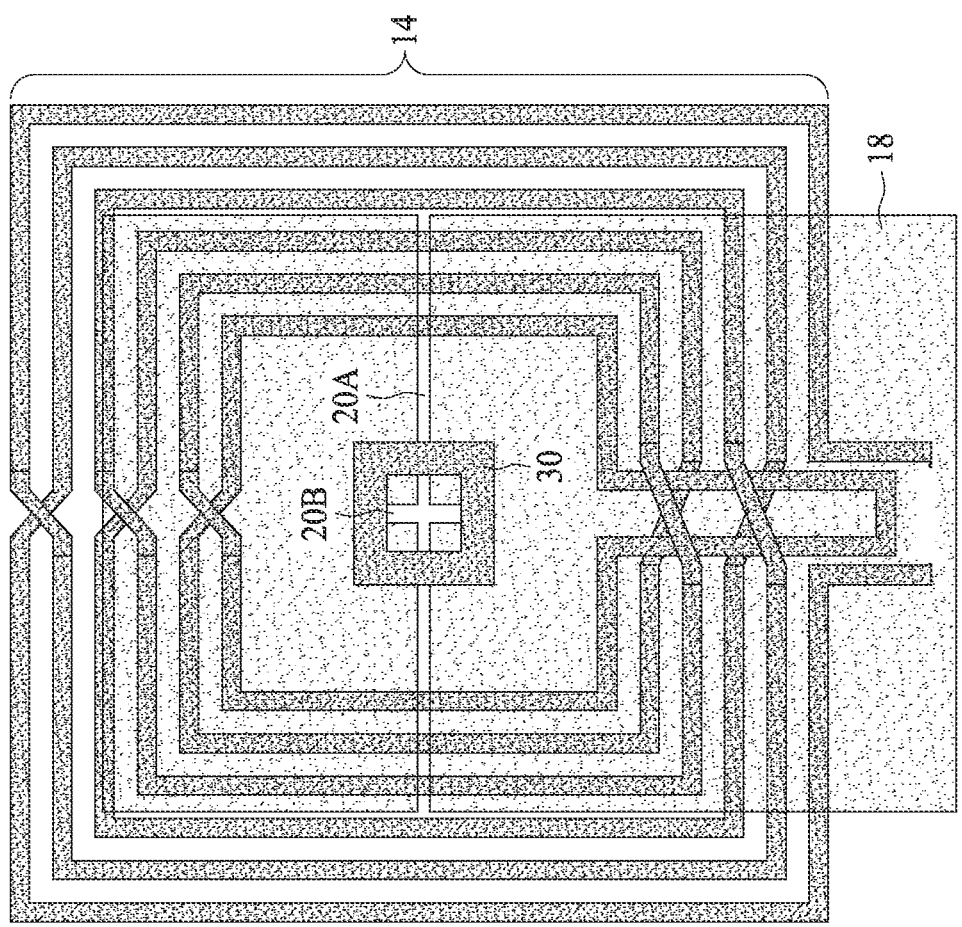

FIGS. 6, 7, and 8 illustrate the structures on which simulations are performed. FIG. 6 illustrates the perspective view of coil 14 and coil 30. InFo coil 30 is over coil 14, with no metal plate between InFo coil 30 and coil 14. Furthermore, InFo coil 30 is above coil 14, and the center of coil 30 is aligned to the center of coil 14. According to the simulation results, the mutual inductance between InFo coil 30 and coil 14 is 123.6 nH. In this setting, the electromagnetic field generated by coil 14 is transmitted to InFO coil 30 without being blocked.

FIG. 7 illustrates the perspective view of coil 14 and coil 30, on which a simulation is performed. InFo coil 30 is over and aligned to coil 14, with a large metal plate 22 between (and aligned to) InFo coil 30 and coil 14. Metal plate 22 has no slot therein, and hence fully blocks the electromagnetic field generated by coil 14 from being transmitted to coil 30. According to the simulation results, the mutual inductance between InFo coil 30 and coil 14 is 0.1 nH, indicating that essentially no mutual inductance exists between InFo coil 30 and coil 14. Accordingly, InFO coil 30 and coil 14 cannot be used for wireless power transfer when an un-slotted metal plate (such as an un-slotted metal back cover of a phone) is placed therebetween. The results obtained from FIGS. 6 and 7 are used as benchmarks to compare the performance of other structures in accordance with various embodiments of the present disclosure.

FIG. 8 illustrates the top view of coil 14 and coil 30, on which a simulation is performed. InFo coil 30 is over coil 14, with slot-containing metal plate 18 (same as what is shown in FIG. 5) placed between InFo coil 30 and coil 14. According to the simulation results, the mutual inductance between InFo coil 30 and coil 14 is 192 nH. It is noted that this mutual inductance is greater than the mutual inductance obtained from FIG. 6 (123.6 nH). This indicates that the cross-shaped slot as shown in FIG. 5 not only allows the full passing-through of the electromagnetic field, the electromagnetic field is also magnified, which means better efficiency in the wireless charging.

Referring again back to FIG. 5, if the widths W1 and/or W2 of slot 20 are too big, for example, equal to or greater than width W3 of coil 30, the mutual inductance would be reduce to the mutual inductance (123.6 nH) obtained from FIG. 6. Accordingly, keeping widths W1 and/or W2 not too big is beneficial for increasing the mutual inductance. On the other hand, widths W1 and/or W2 cannot be too small since the slots with very small widths W1 and/or W2 do not allow the electromagnetic field to pass easily, and the mutual inductance may degrade to the mutual inductance obtained in FIG. 7. In accordance with some embodiments, widths W1 and/or W2 are equal to or greater than the wavelength of the power applied on coil 14.

Figure 9:
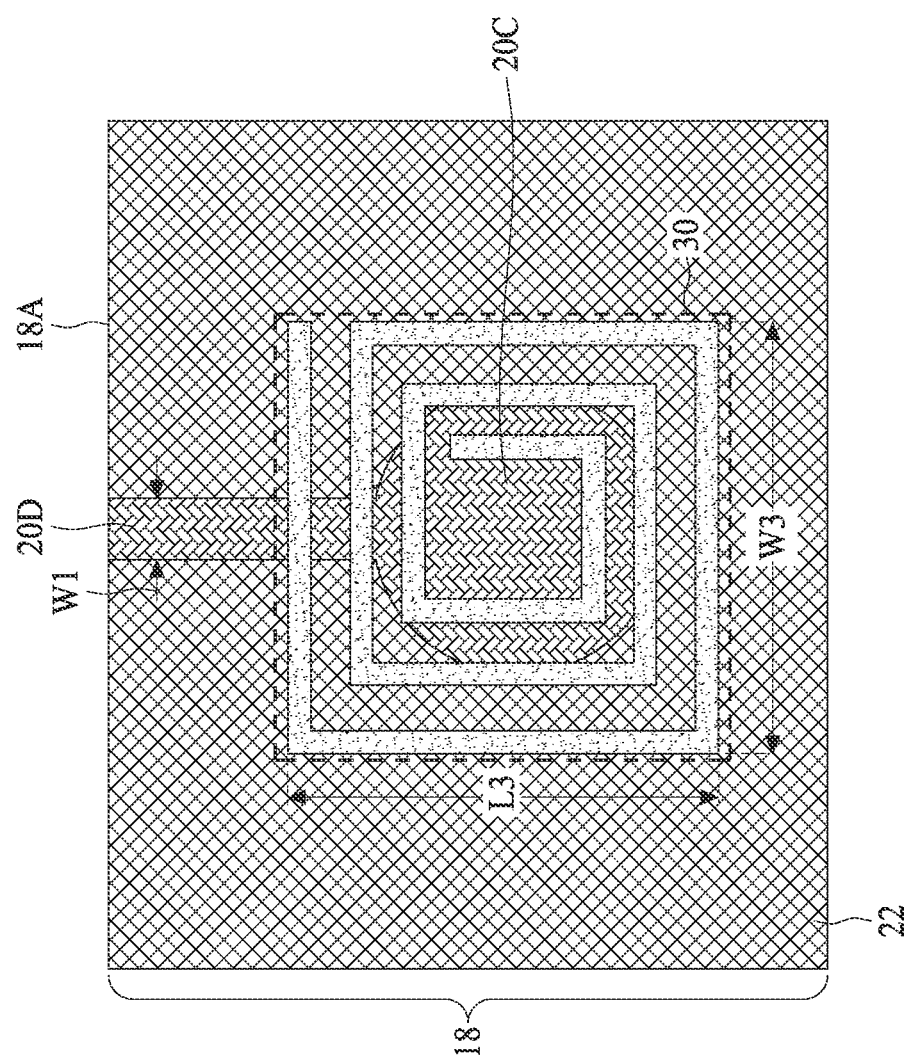

FIG. 9 illustrates a top view of a part of the structure shown in FIGS. 1 and 2 in accordance with some exemplary embodiments, with coil 30 and slot-containing metal plate 18 illustrated. Dielectric material 20 includes central bulk portion 20C and elongated portion 20D, which is joined to bulk portion 20C to form a continuous dielectric region. Bulk portion 20C is overlapped by coil 30 (when viewed in the cross-sectional view). In accordance with some exemplary embodiments. Bulk portion 20C is smaller (in the top view as in FIG. 6) than coil 30. Furthermore, all edges of bulk portion 20C may be rescinded from the respective edges of coil 30, and hence coil 30 fully overlaps bulk portion 20C. Alternatively stated, coil 30 extends beyond the edges of bulk portion 20C. In accordance with some exemplary embodiments, the center of the intersection area of portions 20A and 20B is aligned to the center of coil 30. The top view of coil 30 may have a circular shape, a rectangular shape, a hexagonal shape, an octagonal shape, or another applicable shape.

Elongated portion 20D has a first end connected to bulk portion 20C, and a second end extending beyond the respective edge (the illustrated upper edge) of coil 14. In accordance with some embodiments, as illustrated in FIG. 9, elongated portion 20D extends to edge 18A of slot-containing metal plate 18. In accordance with alternative embodiments, elongated portion 20D extends beyond the respective edge (the illustrated upper edge) of coil 14, and does not reach edge 18A. Width W1 of elongated portion is smaller than width W3 of coil 30 in accordance with some embodiments.

Figure 10:
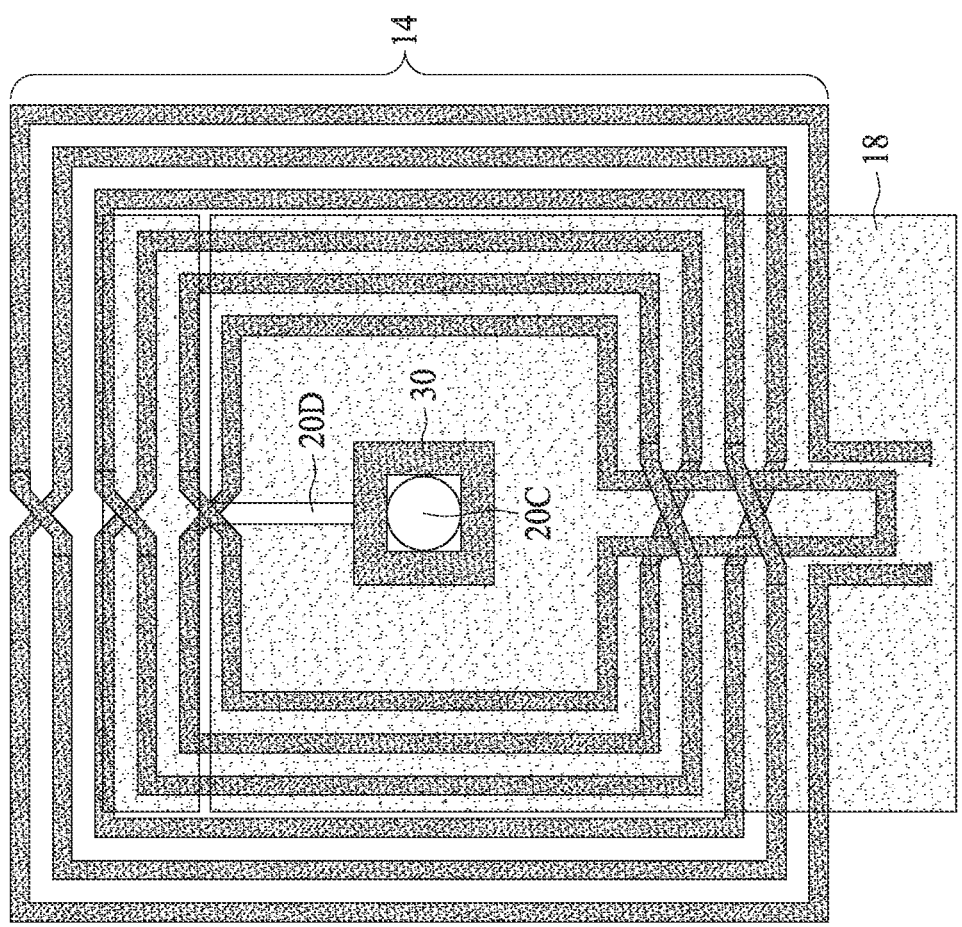

FIG. 10 illustrates the top view of coil 14 and coil 30, on which a simulation is performed. InFo coil 30 is over coil 14, with slot-containing metal plate 18 (similar to what is shown in FIG. 9, and with an additional slot) placed between InFo coil 30 and coil 14. According to the simulation results, the mutual inductance between InFo coil 30 and coil 14 is 240.4 nH. The results are similar if the additional slot is not added. It is noted that this mutual inductance is greater than the mutual inductance obtained from FIG. 6 (123.6 nH). This indicates that the slot as shown in FIG. 9 has the effect of magnifying the electromagnetic field, which means better efficiency in the wireless charging.

Referring again back to FIG. 9, if portion 20C is too large, for example, with sizes equal to or greater than the size of coil 30, the mutual inductance would be close to the mutual inductance obtained from FIG. 6. Accordingly, keeping the size of portion 20C to be smaller than the size of coil 30 is beneficial for increasing mutual inductance.

Figure 11:
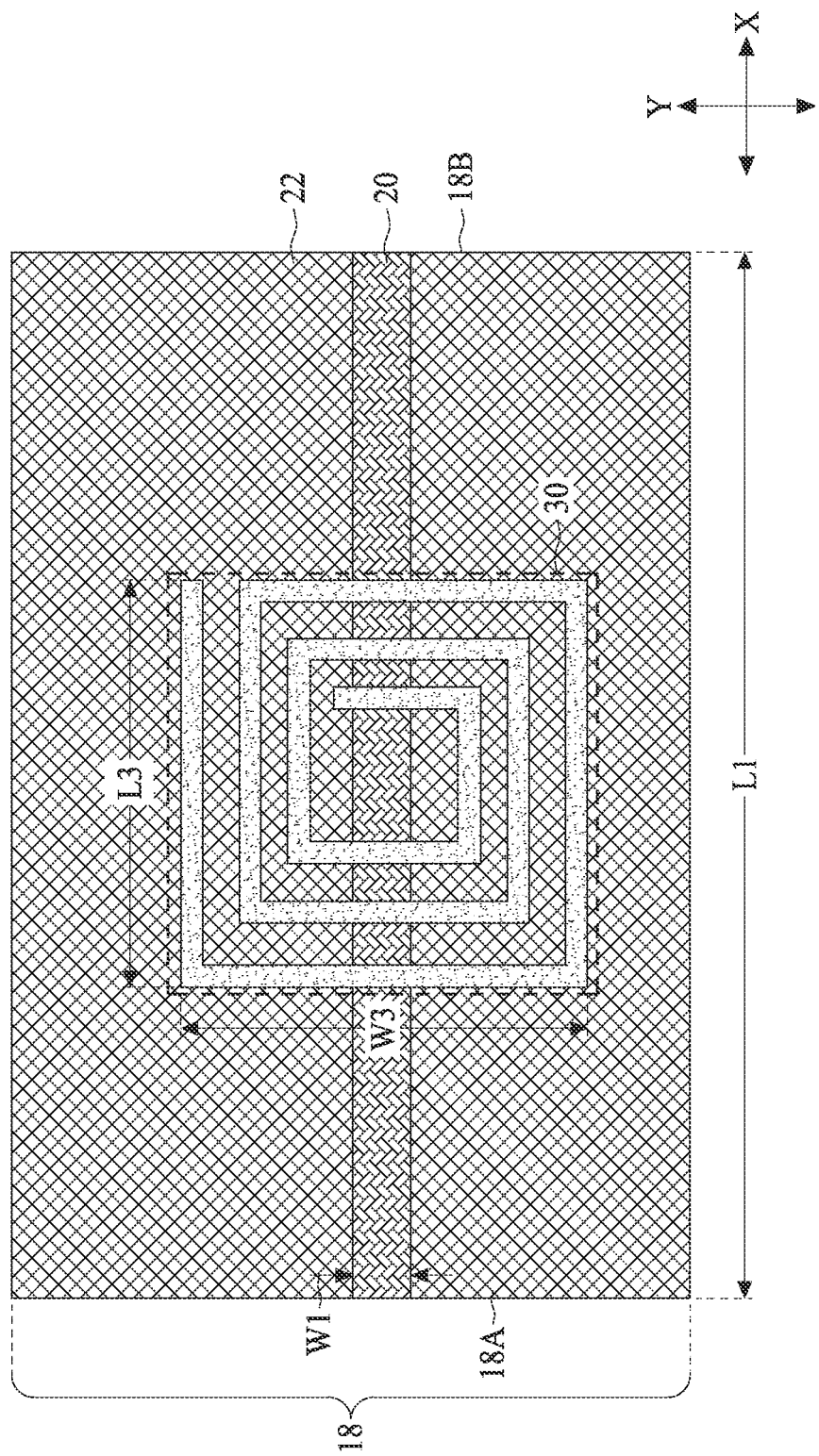

FIG. 11 illustrates a top view of a part of the structure shown in FIGS. 1 and 2 in accordance with some exemplary embodiments, with coil 30 and slot-containing metal plate 18 illustrated. The shape of dielectric material 20 in accordance with these embodiments is similar to that in FIG. 5, except no shorter portion exists. Dielectric material 20 extends to both edges 18A and 18B of slot-containing metal plate 18. Dielectric material 20 is in a single stripe-shaped slot, which extends from edge 18A to opposite edge 18B of slot-containing metal plate 18. Dielectric material 20 extends beyond the edges of coil 30 in opposite X directions, and length L1 of dielectric material 20 is greater than length L3 of coil 30. On the other hand, width W1 of dielectric material 20 is smaller than width W3 of coil 30.

Figure 12:
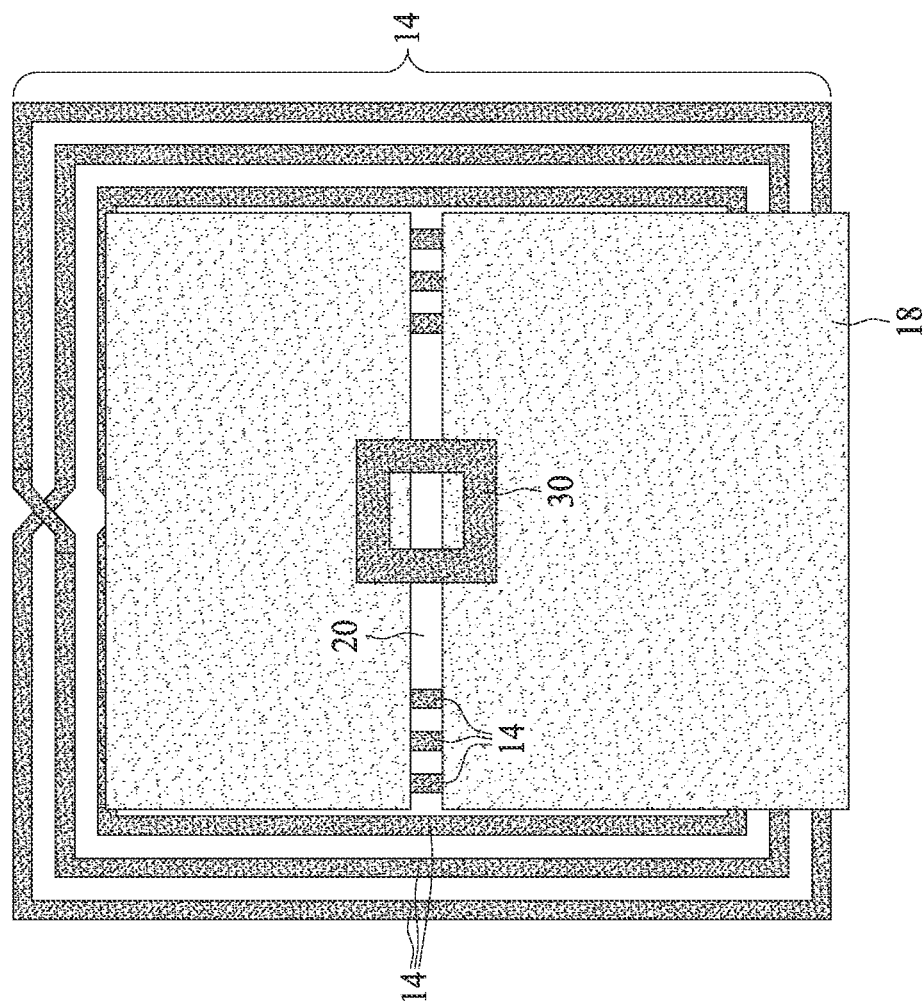

FIG. 12 illustrates the top view of coil 14 and coil 30, on which a simulation is performed. InFo coil 30 is over coil 14, with slot-containing metal plate 18 as shown in FIG. 11 placed between InFo coil 30 and coil 14. According to the simulation results, the mutual inductance between InFo coil 30 and coil 14 is 137.9 nH. It is noted that this mutual inductance is greater than the mutual inductance obtained from FIG. 6 (123.6 nH). This indicates that the slot as shown in FIG. 11 also has the effect of magnifying the electromagnetic field, which means better efficiency in the wireless charging.

Referring again back to FIG. 11, if width W1 of dielectric material 20 is too large, for example, greater than width W3 of coil 30, the mutual inductance would be reduced to the mutual inductance obtained from FIG. 6. Accordingly, keeping width W1 to be smaller than width W3 of coil 30 is beneficial for increasing the mutual inductance. On the other hand, width W1 cannot be too small since the slots with very small width W1 do not allow the electromagnetic field to pass easily, and the mutual inductance may degrade to the mutual inductance obtained in FIG. 7.

Figure 13:
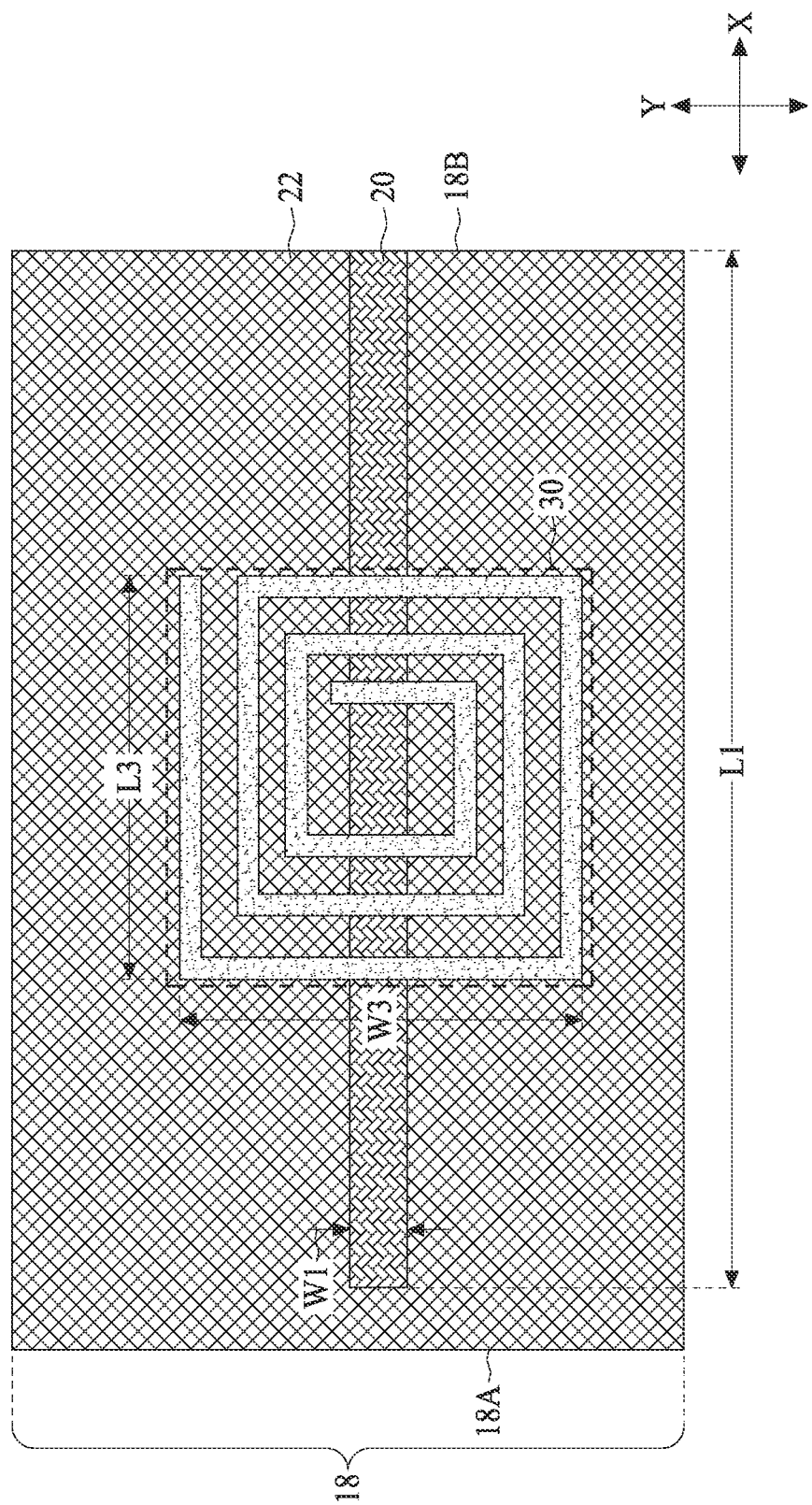

FIG. 13 illustrates a top view of a part of the structure shown in FIGS. 1 and 2 in accordance with some exemplary embodiments, with coil 30 and slot-containing metal plate 18 illustrated. The shape of dielectric material 20 in accordance with these embodiments is similar to that in FIG. 11, except dielectric material 20 extends to edge 18B and does not extend to edge 18A. Similarly, dielectric material 20 extends beyond the edges of coil 30 in both X directions, and length L1 of dielectric material 20 is greater than length L3 of coil 30. On the other hand, width W1 of dielectric material 20 is smaller than width W3 of coil 30.

Figure 14:
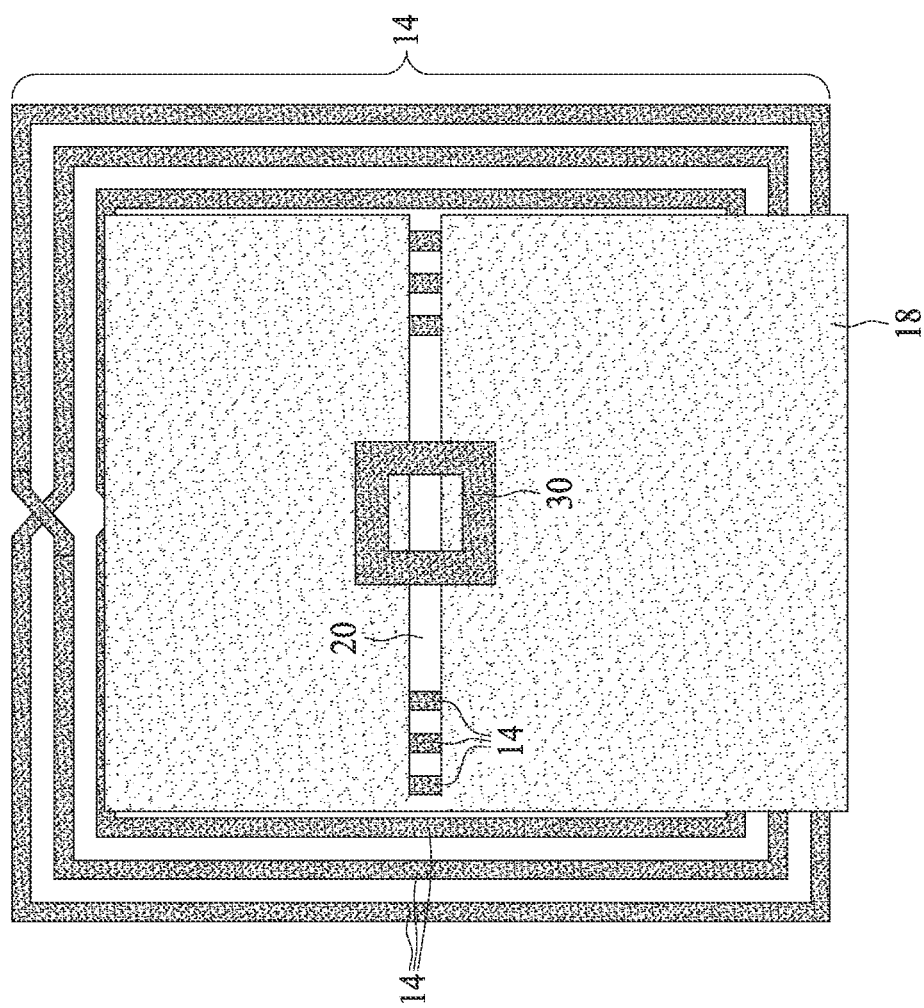

FIG. 14 illustrates the top view of coil 14 and coil 30, on which a simulation is performed. InFo coil 30 is over coil 14, with slot-containing metal plate 18 as shown in FIG. 13 placed between InFo coil 30 and coil 14. According to the simulation results, the mutual inductance between InFo coil 30 and coil 14 is 138.2 nH. It is noted that this mutual inductance is greater than the mutual inductance obtained from FIG. 6 (123.6 nH). This indicates that the slot as shown in FIG. 13 has the effect of magnifying the electromagnetic field, which means better efficiency in the wireless charging. The width W1 and length L1 of dielectric material 20 have similar requirement as in FIG. 11.

Figure 15:
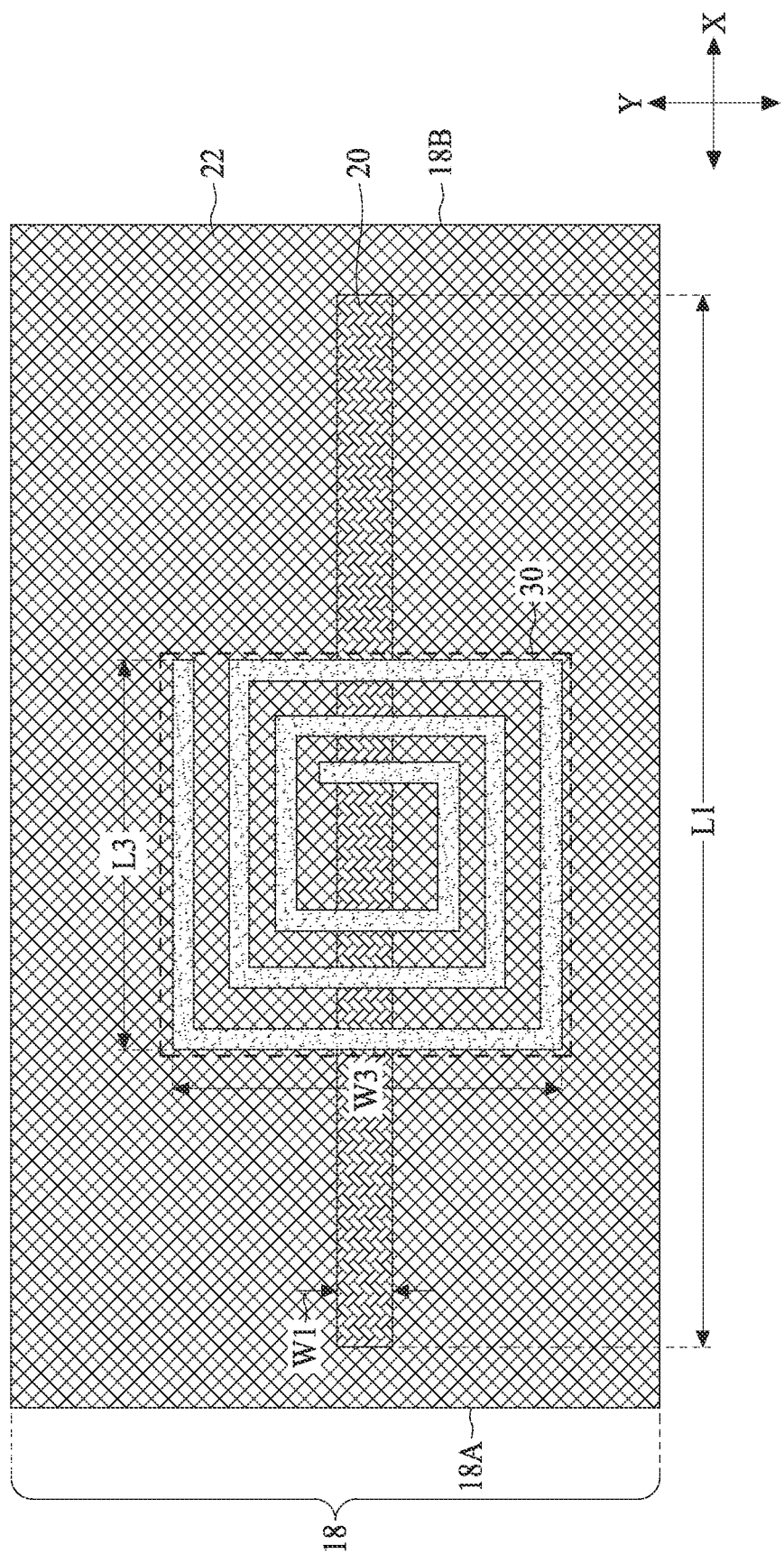

FIG. 15 illustrates a top view of a part of the structure shown in FIGS. 1 and 2, with coil 30 and slot-containing metal plate 18 illustrated in accordance with some exemplary embodiments. The shape of dielectric material 20 in accordance with these embodiments is similar to that in FIG. 11, except dielectric material 20 is fully encircled by metal plate 18, and does not extend to either one of edges 18A and 18B. Similarly, dielectric material 20 extends beyond edges of coil 30 in both X directions, and length L1 of dielectric material 20 is greater than length L3 of coil 30. On the other hand, width W1 of dielectric material 20 is smaller than width W3 of coil 30.

Figure 16:
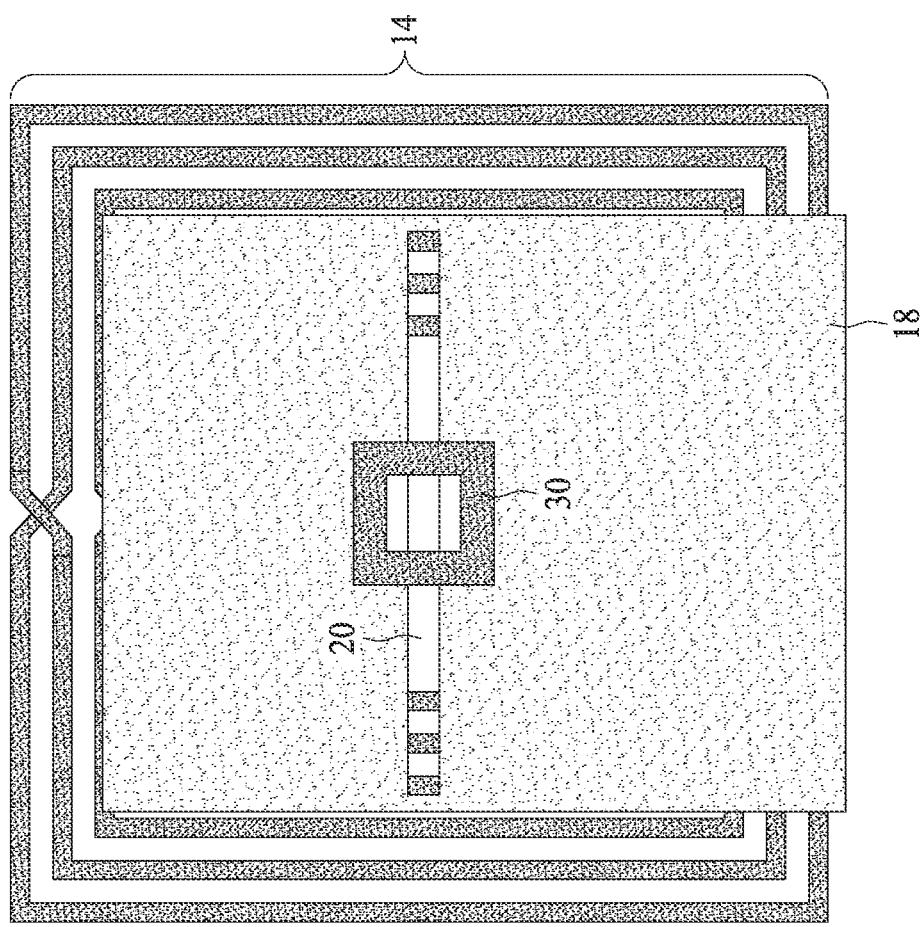

FIG. 16 illustrates the top view of coil 14 and coil 30, on which a simulation is performed. InFo coil 30 is over coil 14, with slot-containing metal plate 18 as shown in FIG. 15 placed between InFo coil 30 and coil 14. According to the simulation results, the mutual inductance between InFo coil 30 and coil 14 is 29.8 nH. It is noted that this mutual inductance is smaller than the mutual inductance obtained from FIG. 6 (123.6 nH). This indicates that the slot as shown in FIG. 13 allows the electromagnetic field to pass through, although with reduced magnitude. Further comparing the results in FIGS. 8, 10, 12, 14, and 16, it is observed that allowing the dielectric material (slot) in the metal plate to extend to an edge of the metal plate may lead to improved mutual inductance, while not allowing the dielectric material (slot) to reach the edges results in degraded mutual inductance.

The embodiments of the present disclosure have some advantageous features. By forming slot(s) in metal plates, electromagnetic field may pass through the metal pate, and the mutual inductance between the InFO coil and an external coil is improved. Furthermore, the mutual inductance may be magnified, resulting in the improvement in wireless charging efficiency.

In accordance with some embodiments of the present disclosure, a structure includes an encapsulating material, and a coil including a through-conductor. The through-conductor is in the encapsulating material, with a top surface of the through-conductor substantially coplanar with a top surface of the encapsulating material, and a bottom surface of the through-conductor substantially coplanar with a bottom surface of the encapsulating material. A metal plate is underlying the encapsulating material. A slot is in the metal plate and filled with a dielectric material. The slot has a portion overlapped by the coil.

In accordance with some embodiments of the present disclosure, a structure includes an encapsulating material, a device die encapsulated in the encapsulating material, and through-conductors encapsulated in the encapsulating material. The through-conductors form parts of a coil electrically coupled to the device die. The structure further includes a metal plate with a portion overlapped by the coil, wherein the metal plate extends beyond edges of the coil. A dielectric material penetrates through the metal plate. The dielectric material includes a first elongated portion having a first lengthwise direction parallel to a first direction. The first elongated portion includes a first portion overlapped by the coil, and a second portion un-overlapped by the coil. The dielectric material further includes a second elongated portion having a second lengthwise direction parallel to a second direction, with the second direction unparallel to the first direction. The second elongated portion is joined to the first elongated portion, and is overlapped by the coil.

In accordance with some embodiments of the present disclosure, a structure includes an encapsulating material, a device die encapsulated in the encapsulating material, and through-conductors encapsulated in the encapsulating material. The through-conductors form parts of a coil electrically coupled to the device die. The structure further includes a metal plate with a portion overlapped by the coil. The metal plate extends beyond edges of the coil. A dielectric region penetrates through the metal plate. The dielectric region includes a bulk portion overlapped by the coil, and an elongated portion connected to the bulk portion. The elongate portion is narrower than the bulk portion. The elongate portion includes a first portion overlapped by the coil, and a second portion extending beyond an edge of the coil.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    an encapsulant;
    a device die in the encapsulant;
    through-conductors in the encapsulant, wherein the through-conductors form parts of a coil, and the coil is electrically coupled to the device die;
    a metal plate having a portion overlapped by the coil, wherein the metal plate extends beyond edges of the coil, and wherein the metal plate is electrically insulated from the coil; and
    a dielectric region in the metal plate and comprising a portion overlapped by the coil, wherein the dielectric region comprises:
        a strip portion having a uniform first width; and
        an enlarged portion joined with the strip portion, wherein the enlarged portion has a second width greater than the uniform first width.

2. The structure of claim 1, wherein the metal plate extends laterally beyond the coil in all lateral directions.

3. The structure of claim 1, wherein the dielectric region comprises an organic material.

4. The structure of claim 1, wherein the dielectric region comprises an inorganic material.

5. The structure of claim 1 further comprising a dielectric film between, and contacting both of, the metal plate and the coil.

6. The structure of claim 1 further comprising redistribution lines over the coil and the encapsulant, wherein the redistribution lines electrically connect the device die to the coil.

7. The structure of claim 1, wherein the strip portion has a lengthwise direction and a widthwise direction perpendicular to the lengthwise direction, and wherein both of the uniform first width and the second width are measured in the widthwise direction.

8. The structure of claim 1, wherein the enlarged portion has a circular top-view shape.

9. A structure comprising:
    an encapsulant;
    a device die encapsulated by the encapsulant;
    through-conductors encapsulated in the encapsulant, wherein the through-conductors form parts of a coil, and the coil is electrically coupled to the device die;
    a metal plate underlying the coil, wherein the metal plate laterally extends beyond edges of the coil; and
    a dielectric material penetrating through the metal plate, wherein the dielectric material comprises:
        a first portion having a lengthwise direction parallel to a first direction, wherein the first portion has a first width; and
        a second portion having a second width greater than the first width, wherein the second portion has an end spaced apart from a respective nearest edge of the metal plate, and wherein both of the first width and the second width are measured in a widthwise direction perpendicular to the lengthwise direction.

10. The structure of claim 9, wherein the first portion and the second portion are continuously joined with each other.

11. The structure of claim 9, wherein the first portion of the dielectric material comprises a first sub portion overlapped by the coil, and a second sub portion extending laterally beyond the coil.

12. The structure of claim 11, wherein the first portion of the dielectric material further comprises a third sub portion extending laterally beyond the coil, wherein the second sub portion and the third sub portion are on opposing sides of the coil.

13. The structure of claim 9, wherein the first portion extends to an edge of the metal plate.

14. The structure of claim 9, wherein the second portion has a first center substantially vertically aligned to a second center of the coil.

15. The structure of claim 9, wherein the metal plate extends laterally beyond the coil in all lateral directions.

16. A structure comprising:
a molding compound;
through-conductors encapsulated in the molding compound, wherein the through-conductors form parts of a coil; and
a dielectric region comprising:
an elongated portion having a uniform width, wherein the elongated portion comprises a first part overlapped by the coil, and a second part extending beyond an outmost edge of the coil; and
an enlarged portion directly underlying the coil, wherein the elongated portion and the enlarged portion are joined with each other.

17. The structure of claim 16, wherein an entirety of the enlarged portion is underlying the coil.

18. The structure of claim 16, wherein a first center of the enlarged portion is substantially vertically aligned to a second center of the coil.

19. The structure of claim 16, wherein the dielectric region comprises an air gap.

20. The structure of claim 16 further comprising a metal plate, wherein a first top surface of the dielectric region is coplanar with a second top surface of the metal plate, and wherein a first bottom surface of the dielectric region is coplanar with a second bottom surface of the metal plate.

* * * * *